(12) United States Patent
Song

(10) Patent No.: US 8,839,019 B2
(45) Date of Patent: Sep. 16, 2014

(54) SEMICONDUCTOR APPARATUS FOR CONTROLLING A FREQUENCY CHANGE OF AN INTERNAL CLOCK

(71) Applicant: SK hynix Inc., Icheon-si (KR)

(72) Inventor: Choung Ki Song, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 88 days.

(21) Appl. No.: 13/709,130

(22) Filed: Dec. 10, 2012

(65) Prior Publication Data

US 2013/0293271 A1 Nov. 7, 2013

(30) Foreign Application Priority Data

May 4, 2012 (KR) .................. 10-2012-0047465

(51) Int. Cl.
*G06F 1/08* (2006.01)
*H03K 21/00* (2006.01)
(52) U.S. Cl.
CPC . *H03K 21/00* (2013.01); *G06F 1/08* (2013.01)
USPC ........... 713/501; 327/115; 327/117; 327/291; 327/295; 365/189.011; 713/500

(58) Field of Classification Search
USPC ......... 327/113–115, 117, 118, 291, 295, 296; 365/189.011, 191; 713/500, 501, 503
See application file for complete search history.

(56) References Cited

U.S. PATENT DOCUMENTS 7,164,615 B2 * 1/2007 Park et al. .................... 365/222

FOREIGN PATENT DOCUMENTS

KR 1020060049862 A 5/2006

* cited by examiner

*Primary Examiner* — Patrick O'Neill
(74) *Attorney, Agent, or Firm* — William Park & Associates Patent Ltd.

(57) ABSTRACT

A semiconductor apparatus includes a clock frequency change block configured to output a plurality of internal clocks with different frequencies by dividing a frequency of an external clock in response to a mode register set signal and a setting command to enable the plurality of internal clocks to be outputted, and generate a flag signal to designate the completion of the output, and a command generation block configured to receive a command and generate the setting command in response to the flag signal and the mode register to set signal.

20 Claims, 5 Drawing Sheets

SEMICONDUCTOR APPARATUS FOR CONTROLLING A FREQUENCY CHANGE OF AN INTERNAL CLOCK

CROSS-REFERENCES TO RELATED APPLICATION

The present application claims priority under 35 U.S.C. §119(a) to Korean application number 10-2012-0047465, filed on May 4, 2012, in the Korean Intellectual Property Office, which is incorporated herein by reference in its entirety.

BACKGROUND

1. Technical Field

The present invention relates generally to a semiconductor integrated circuit, and more particularly, to a mechanism that changes the frequency of a clock in a semiconductor apparatus.

2. Related Art

In general, a semiconductor apparatus performs a read is operation or a write operation by synchronizing a command with the edge of a clock.

For example, a semiconductor apparatus synchronizes a command with the rising edge of a clock and provides the command to an internal circuit. The command should be provided a predetermined time before the arrival of the rising edge of the clock, to ensure that the semiconductor apparatus is in a standby state to precisely recognize and receive the command at the rising edge of the clock. Also, the level of the command should be retained for a predetermined time even after the rising edge of the clock, to ensure that the semiconductor apparatus precisely performs the mode indicated by the command.

The predetermined time by which a command should be provided before the arrival of the edge of a clock for synchronization is referred to as setup time, and the predetermined time by which the level of the command should be retained is referred to as hold time.

FIG. 1 is a block diagram of the command latch unit of a conventional semiconductor apparatus. The command latch unit of the semiconductor apparatus includes a latch section 10 which receives a command CMDB and outputs an internal command ICMD in synchronization with a clock CLK. The command CMDB may be a plurality of commands, such as a chip select signal CS, an active signal ACT, a row address strobe signal RAS, a column address strobe signal CAS and a write enable signal WE. Accordingly, the command latch unit of the semiconductor apparatus may be constituted by a plurality of latch sections to latch the respective commands.

FIGS. 2a and 2b are timing diagrams of the command latch unit of the conventional semiconductor apparatus.

Generally, the read or write operation of the semiconductor apparatus is performed by combining the plurality of commands CMDB such as the chip select signal CS, the active signal ACT, the row address strobe signal RAS, the column address strobe signal CAS, the write enable signal WE, and so on. Thus, if the pulse width of the command CMDB is the same as one cycle (1*tCK) of the clock CLK as shown in FIG. 2a, the internal command ICMD has the same setup/hold time as the pulse width of the command CMDB, and the semiconductor apparatus may precisely perform the mode indicated by the command CMDB.

However, if the pulse width of the command CMDB is larger than one cycle (1*tCK) of the clock CLK as shown in FIG. 2b, the internal command ICMD has a different setup/hold time from the pulse width of the command CMDB, and the semiconductor apparatus may not precisely recognize the mode indicated by the command CMDB. In the case where the pulse width of the internal command ICMD changes, the semiconductor apparatus may fail to perform an operation mode according to an input signal.

SUMMARY

In one embodiment of the present invention, a semiconductor apparatus includes: a clock frequency change block configured to output a plurality of internal clocks with different frequencies by dividing a frequency of an external clock in response to a mode register set signal and a setting command to enable the plurality of internal clocks to be outputted, and generate a flag signal to designate the completion of the output; and a command generation block configured to receive a command and generate the setting command in response to the flag signal and the mode register set signal.

In another embodiment of the present invention, a semiconductor apparatus includes: a clock frequency change block configured to generate a plurality of internal clocks with different frequencies by dividing an external clock in response to a frequency change signal which allows a mode for changing a frequency of a clock to be entered and a no operation command which sets to allow the plurality of internal clocks to be generated, and generate a frequency change end signal to designate the completion of the mode for changing a frequency of a clock, in response to the no operation command; and a command generation block configured to receive a command and generate the no operation command in response to the frequency change signal and the frequency change end signal.

BRIEF DESCRIPTION OF THE DRAWINGS

Features, aspects, and embodiments are described in conjunction with the attached drawings, in which.

DETAILED DESCRIPTION

Hereinafter, a semiconductor apparatus according to the present invention will be described below with reference to the accompanying drawings through various embodiments.

Figure 1:
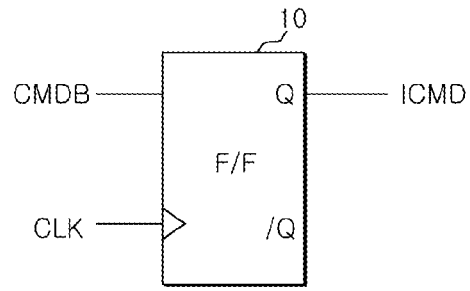
FIG. 1 is a block diagram of the command latch unit of a conventional semiconductor apparatus.
Figure 2A:
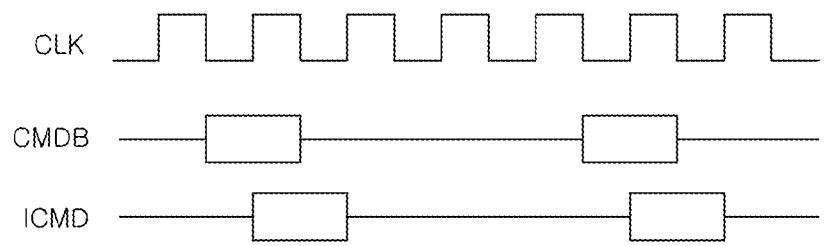
FIG. 2a is a timing diagram when a pulse width of the command CMDB is the same as one cycle (1*tCK) of the clock CLK according to FIG. 1.
Figure 2B:
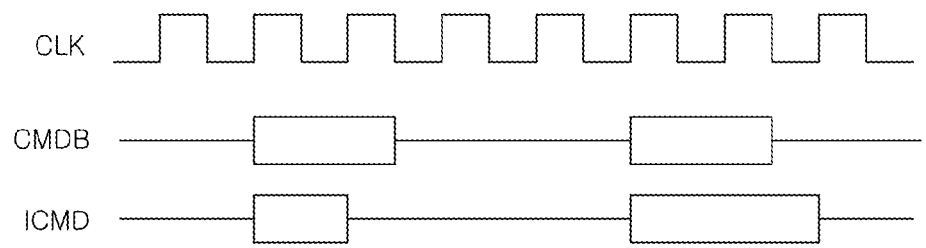
FIG. 2b is a timing diagram when a pulse width of the command CMDB is larger than one cycle (1*tCK) of the clock CLK according to FIG. 1.
Figure 3:
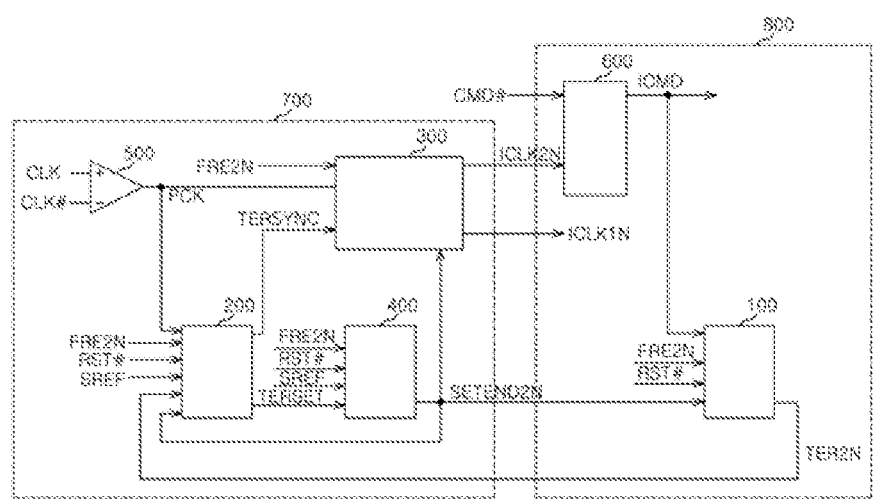
FIG. 3 is a schematic block diagram of a semiconductor apparatus in accordance with an embodiment of the present invention.

FIG. 3 is a schematic block diagram of a semiconductor apparatus in accordance with an embodiment of the present invention.

Referring to FIG. 3, a semiconductor apparatus in accordance with an embodiment of the present invention includes a clock frequency change block 700 and a command generation block 800.

The command generation block 800 includes a sync pulse generation unit 100 and a command output unit 600. The clock frequency change block 700 includes a command shifter 200, a clock generation unit 300, a sensing unit 400, and an amplification unit 500.

The semiconductor apparatus in accordance with the embodiment of the present invention changes the frequency of external clocks CLK and CLK# in response to a reset signal RST#, a command CMD#, a frequency change signal FRE2N and a self refresh signal SREF.

Various operation modes of a semiconductor apparatus are preset and stored in mode registers, where a set of these mode registers is referred to as a mode register set (MRS). The frequency change signal FRE2N is an operation mode signal which is preset from an MRS signal. The semiconductor apparatus changes the external clocks CLK and CLK# in response to the MRS signal and produces a plurality of internal clocks ICLK1N and ICLK2N with different frequencies. Accordingly, the frequency change signal FRE2N is a signal which allows the semiconductor apparatus to enter a mode where the external clocks CLK and CLK# are changed to produce a plurality of internal clocks ICLK1N and ICLK2N with different frequencies.

The sync pulse generation unit 100 is configured to generate a no operation command TER2N in response to an internal command ICMD, the reset signal RST#, the frequency change signal FRE2N and a frequency change end signal SETEND2N. The sync pulse generation unit 100 generates the no operation command TER2N when the frequency change signal FRE2N and the reset signal RST# are activated, and interrupts the output of the no operation command TER2N when the frequency change end signal SETEND2N is activated. The no operation command TER2N is a signal which sets the components of the semiconductor apparatus in accordance with the embodiment of the present invention to enable them to change the external clocks CLK and CLK# and produce the plurality of internal clocks ICLK1N and ICLK2N with different frequencies.

The command output unit 600 is configured to latch the command CMD# and generate the internal command ICMD. The command CMD# inputted to the command output unit 600 may be a plurality of commands including a chip select signal CS, an active signal ACT, a row address strobe signal RAS, a column address strobe signal CAS and a write enable signal WE. Similarly, the internal command ICMD outputted from the command output unit 600 may be a plurality of internal commands including an internal chip select signal ICS, an internal active signal IACT, an internal row address strobe signal IRAS, an internal column address strobe signal ICAS and an internal write enable signal IWE. Therefore, the command output unit 600 may include a plurality of flip-flops to latch the plurality of commands CMD# and output the plurality of internal commands ICMD.

When the semiconductor apparatus completes the mode for changing the frequency of a first reference clock PCK in response to the no operation command TER2N, the frequency change end signal SETEND2N is activated.

The first reference clock PCK is a signal which has the same cycle but different amplitude compared to external clocks CLK and CLK#, and is generated by comparing the external clock CLK and the complementary external clock CLK# in the amplification unit 500.

When the frequency change end signal SETEND2N is activated, the sync pulse generation unit 100 interrupts the output of the no operation command TER2N without changing the setting of the semiconductor apparatus determined by the no operation command TER2N.

The command shifter 200 is configured to receive the first reference clock PCK and sequentially delay the no operation command TER2N in response to signals generated by delaying the first reference clock PCK. As a result, the command shifter 200 generates a first control signal TERSYNC and a second control signal TERSET by delaying the no operation command TER2N. The first control signal TERSYNC is input into the clock generation unit 300, thereby resetting it and generating the first internal clock ICLK1N with the same frequency as the first reference clock PCK and the second internal clock ICLK2N with a different frequency from the first reference clock PCK.

The sensing unit 400 is configured to generate the frequency change end signal SETEND2N in response to the frequency change signal FRE2N, the self refresh signal SREF, the reset signal RST# and the second control signal TERSET. The frequency change end signal SETEND2N is a signal which notifies that the frequency of the second internal clock ICLK2N has been changed to be different from the frequency of the external clocks CLK and CLK# or the first reference clock PCK, in response to the second control signal TERSET generated by delaying the no operation command TER2N.

The frequency change end signal SETEND2N is a flag signal indicating that generation of a plurality of internal clocks ICLK1N and ICLK2N with different frequencies from external clocks CLK and CLK# has been completed.

Figure 4:
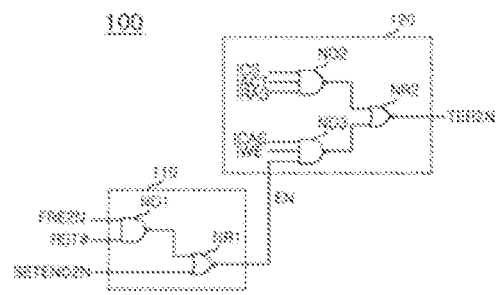
FIG. 4 is a detailed circuit diagram of the sync pulse generation unit shown in FIG. 3.

FIG. 4 is a detailed circuit diagram of the sync pulse generation unit 100 shown in FIG. 3. Operations of the sync pulse generation unit 100 will be described below with reference to FIGS. 3 and 4.

The sync pulse generation unit 100 includes a sync pulse control section 110 and a sync pulse operation section 120.

The sync pulse control section 110 includes a first NAND gate ND1 which NANDs the frequency change signal FRE2N and the reset signal RST# and a first NOR gate NR1 which NORs the output signal of the first NAND gate ND1 and the frequency change end signal SETEND2N and outputs an enable signal EN.

The sync pulse operation section 120 includes a second NAND gate ND2 which NANDs the internal chip select signal ICS, the internal active signal IACT and the internal row address strobe signal IRAS, a third NAND gate ND3 which NANDs the internal column address strobe signal ICAS, the internal write enable signal IWE and the enable signal EN, and a second NOR gate NR2 which NORs the output signal of the second NAND gate ND2 and the output signal of the third NAND gate ND3.

In order to output the frequency of the second internal clock ICLK2N which corresponds to ½ of the frequency of the external clocks CLK and CLK# or the first reference clock PCK, the frequency change signal FRE2N is activated (transitions to a high level).

After power-up of the semiconductor apparatus, the reset signal RST# is released (transitions to a high level). The frequency change end signal SETEND2N is activated (transitions to a high level) when the frequency of the second internal clock ICLK2N corresponds to ½ of the frequency of the external clocks CLK and CLK# or the first reference clock PCK.

Accordingly, the sync pulse control section 110 is configured to output an activated enable signal EN when the frequency of the second internal clock ICLK2N does not correspond to ½ of the frequency of the external clocks CLK and CLK# or the first reference clock PCK, and output a deactivated enable signal EN the frequency of the second internal clock ICLK2N corresponds to ½ of the frequency of the external clocks CLK and CLK# or the first reference clock PCK.

The sync pulse operation section 120 is configured to execute a logic operation for the internal chip select signal ICS, the internal active signal IACT, the internal row address strobe signal IRAS, the internal column address strobe signal ICAS, the internal write enable signal IWE and the enable signal EN, and generate the no operation command TER2N.

The no operation command TER2N in accordance with the embodiment of the present invention is a signal which enables the device to accept the external clocks CLK and CLK# and produce the plurality of internal clocks ICLK1N and ICLK2N with different frequencies, while preventing any unwanted commands from being inputted in the process. This ensures internal clocks ICLK1N and ICLK2N to maintain their frequency preset values.

The internal chip select signal ICS, the internal active signal IACT, the internal row address strobe signal IRAS, the internal column address strobe signal ICAS and the internal write enable signal IWE are signals which are generated by the command output unit 600 in response to the second internal clock ICLK2N, using the chip select signal CS, the active signal ACT, the row address strobe signal RAS, the column address strobe signal CAS and the write enable signal WE.

The sync pulse operation section 120 generates the no operation command TER2N which is activated, when the internal chip select signal ICS, the internal active signal IACT, the internal row address strobe signal IRAS, the internal column address strobe signal ICAS, the internal write enable signal IWE, and the enable signal EN are inputted at high levels.

The no operation command TER2N has an activation period corresponding to the pulse width of the internal chip select signal ICS, the internal active signal IACT, the internal row address strobe signal IRAS, the internal column address strobe signal ICAS and the internal write enable signal IWE.

If the enable signal EN is deactivated (transitions to a low level), the sync pulse operation section 120 does not output the activated no operation command TER2N even when the internal chip select signal ICS, the internal active signal IACT, the internal row address strobe signal IRAS, the internal column address strobe signal ICAS and the internal write enable signal IWE are inputted at the high levels.

Figure 5:
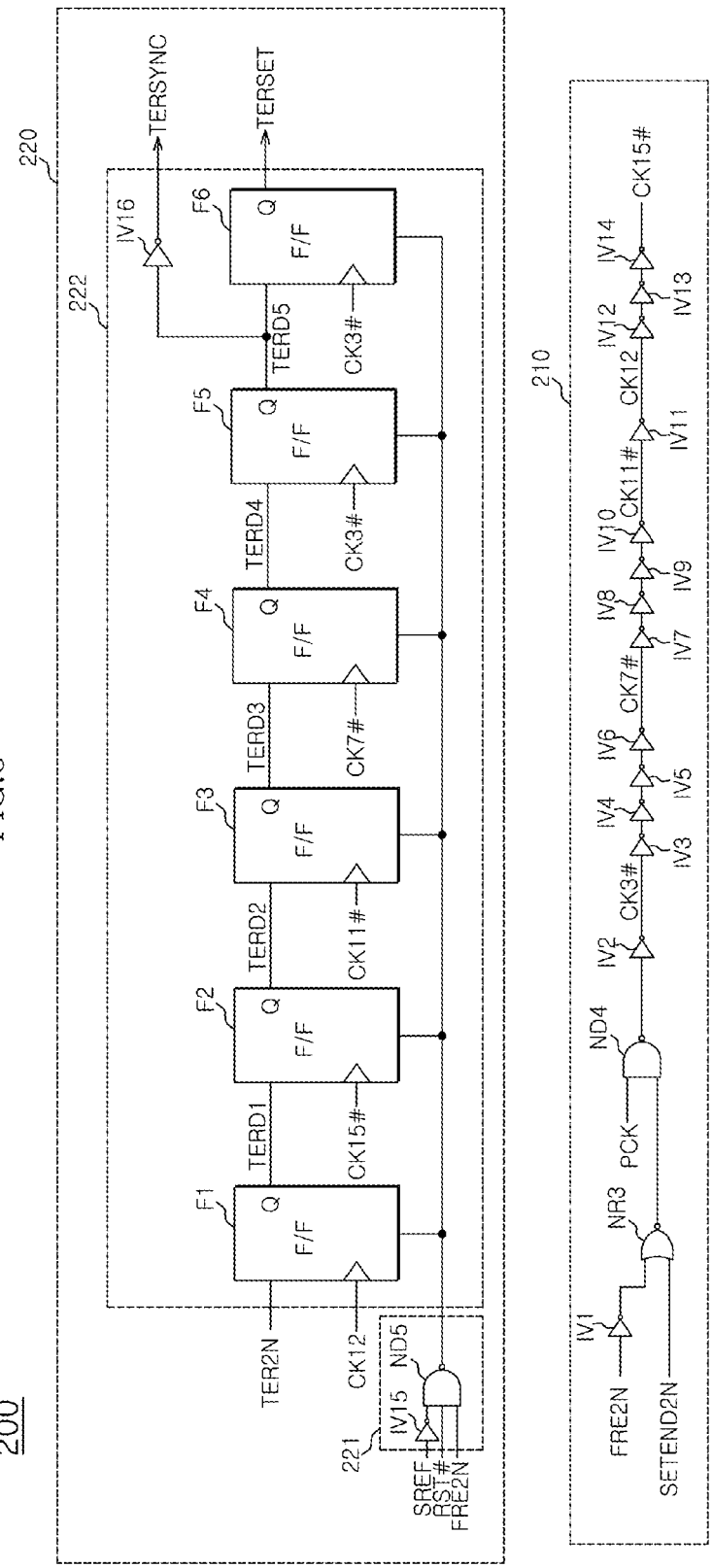
FIG. 5 is a detailed circuit diagram of the command shifter shown in FIG. 3.

FIG. 5 is a detailed circuit diagram of the command shifter 200 shown in FIG. 3. Operations of the command shifter 200 will be described below with reference to FIGS. 3 to 5.

The command shifter 200 includes a reference clock delay section 210 and a control signal generating section 220.

The reference clock delay section 210 is configured to delay the first reference clock PCK and generate a plurality of delayed clocks.

The reference clock delay section 210 includes a first inverter IV1 which inverts the frequency change signal FRE2N and outputs a resultant signal, a third NOR gate NR3 which NORs the output signal of the first inverter IV1 and the frequency change end signal SETEND2N, a fourth NAND gate ND4 which NANDs the output signal of the third NOR gate NR3 and the first reference clock PCK, a second inverter IV2 which inverts the output signal of the fourth NAND gate ND4, a third inverter IV3 which inverts the output signal of the second inverter IV2, a fourth inverter IV4 which inverts the output signal of the third inverter IV3, a fifth inverter IV5 which inverts the output signal of the fourth inverter IV4, a sixth inverter IV6 which inverts the output signal of the fifth inverter IV5, a seventh inverter IV7 which inverts the output signal of the sixth inverter IV6, an eighth inverter IV8 which inverts the output signal of the seventh inverter IV7, a ninth inverter IV9 which inverts the output signal of the eighth inverter IV8, a tenth inverter IV10 which inverts the output signal of the ninth inverter IV9, an eleventh inverter IV11 which inverts the output signal of the tenth inverter IV10, a twelfth inverter IV12 which inverts the output signal of the eleventh inverter IV11, a thirteenth inverter IV13 which inverts the output signal of the twelfth inverter IV12, and a fourteenth inverter IV14 which inverts the output signal of the thirteenth inverter IV13.

The first inverter IV1 inverts the frequency change signal FRE2N and outputs a resultant signal. When the frequency change signal FRE2N is set to a high level, the signal outputted from the first inverter IV1 is set to a low level.

The frequency change end signal SETEND2N is set to a low level when the frequency of the second internal clock ICLK2N does not correspond to ½ of the frequency of the external clocks CLK and CLK# or the first reference clock PCK, and is set to a high level when the frequency of the second internal clock ICLK2N corresponds to ½ of the frequency of the external clocks CLK and CLK# or the first reference clock PCK.

For example, when the frequency of the second internal clock ICLK2N does not correspond to ½ of the frequency of the external clocks CLK and CLK# or the first reference clock PCK, the output of the third NOR gate NR3 is a high level signal since the third NOR gate NR3 receives a low level signal from the first inverter IV1 and a low level signal from the frequency change end signal SETEND2N.

The fourth NAND gate ND4 effectively inverts the first reference clock PCK and outputs a resultant signal when the output signal of the third NOR gate NR3 is set to a high level. If the first reference clock PCK is set to a high level, the output signal of the fourth NAND gate ND4 is set to a low level, and if the first reference clock PCK is set to a low level, the output signal of the fourth NAND gate ND4 is set to a high level.

The second inverter IV2 inverts the output signal of the fourth NAND gate ND4 and outputs a resultant signal. The output signal of the second inverter IV2 is a first delayed clock CK3#.

The third to sixth inverters IV3, IV4, IV5 and IV6 sequentially delay the output signal of the second inverter IV2, and a second delayed clock CK7# is outputted from the sixth inverter IV6.

The seventh to tenth inverters IV7, IV8, IV9 and IV10 sequentially delay the output signal of the sixth inverter IV6, and a third delayed clock CK11# is outputted from the tenth inverter IV10.

The eleventh inverter IV11 inverts the output signal of the tenth inverter IV10 and outputs a fourth delayed clock CK12.

The twelfth to fourteenth inverters IV12, IV13 and IV14 sequentially delay the output signal of the eleventh inverter IV11 and output a fifth delayed clock CK15#.

Accordingly, the first to third delayed clocks CK3#, CK7# and CK11# have the same phase as the first reference clock PCK, and the fourth and fifth delayed clocks CK12 and CK15# have a phase opposite to the first reference clock PCK.

The control signal generating section 220 includes an initialization part 221 and a control signal output part 222. The initialization part 221 includes a fifteenth inverter IV15 which inverts the self refresh signal SREF, and a fifth NAND gate ND5 which NANDs the output signal of the fifteenth inverter IV15, the reset signal RST# and the frequency change signal FRE2N.

The control signal output part 222 includes first to sixth flip-flops F1, F2, F3, F4, F5 and F6 and a sixteenth inverter IV16. The first flip-flop F1 receives the no operation command TER2N and outputs a first delayed no operation command TERD1 in response to the fourth delayed clock CK12 and the output signal of the fifth NAND gate ND5. The second flip-flop F2 receives the first delayed no operation command TERD1 and outputs a second delayed no operation command TERD2 in response to the fifth delayed clock CK15# and the output signal of the fifth NAND gate ND5. The third flip-flop F3 receives the second delayed no operation command TERD2 and outputs a third delayed no operation command TERD3 in response to the third delayed clock CK11# and the output signal of the fifth NAND gate ND5. The fourth flip-flop F4 receives the third delayed no operation command TERD3 and outputs a fourth delayed no operation command TERD4 in response to the second delayed clock CK7# and the output signal of the fifth NAND gate ND5. The fifth flip-flop F5 receives the fourth delayed no operation command TERD4 and outputs a fifth delayed no operation command TERD5 in response to the first delayed clock CK3# and the output signal of the fifth NAND gate ND5. The sixteenth inverter IV16 inverts the fifth delayed no operation command TERD5 and outputs the first control signal TERSYNC. The sixth flip-flop F6 receives the fifth delayed no operation command TERD5 and outputs the second control signal TERSET in response to the first delayed clock CK3# and the output signal of the fifth NAND gate ND5.

The initialization part 221 outputs a signal which determines whether to initialize the control signal output part 222, depending on the output of the fifth NAND gate ND5, which in turn is determined by the self refresh signal SREF, the reset signal RST# and the frequency change signal FRE2N inputs.

In general, a semiconductor apparatus deactivates a clock in a self refresh mode. When the semiconductor apparatus starts operating after the self refresh mode, a clock with a frequency different from a preset frequency is likely to be outputted, which may be problematic. To avoid this, the initialization part 221 controls the control signal output part 222 in response to the self refresh signal SREF.

When the self refresh signal SREF is deactivated and the reset signal RST# and the frequency change signal FRE2N are activated, the initialization part 221 outputs a signal to activate the control signal output part 222 via the fifth NAND gate ND5.

The control signal output part 222 delays the no operation command TER2N by a predetermined time in response to the first to fifth delayed clocks CK3#, CK7#, CK11#, CK12 and CK15# and outputs the first control signal TERSYNC and the second control signal TERSET.

Since the first control signal TERSYNC is an inverted signal of the fifth delayed no operation command TERD5 and the second control signal TERSET is a signal which is generated by delaying the fifth delayed no operation command TERD5 by a predetermined time, the first control signal TERSYNC and the second control signal TERSET have a complementary relationship.

Figure 6:
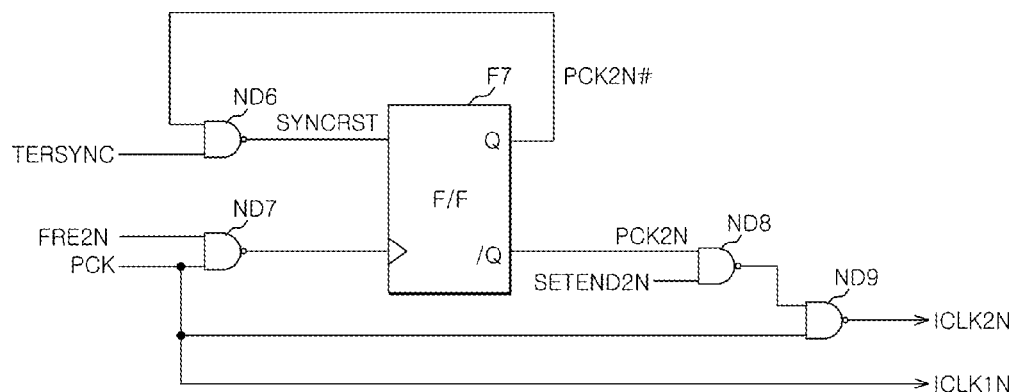
FIG. 6 is a detailed circuit diagram of the clock generation unit shown in FIG. 3.

FIG. 6 is a detailed circuit diagram of the clock generation unit 300 shown in FIG. 3.

Referring to FIGS. 3 to 6, the clock generation unit 300 includes a sixth NAND gate ND6 which generates a sync reset signal SYNCRST in response to the first control signal TERSYNC and a complementary second reference clock PCK2N#, a seventh NAND gate ND7 which NANDs the frequency change signal FRE2N and the first reference clock PCK, a seventh flip-flop F7 which outputs a second reference clock PCK2N with a frequency corresponding to ½ of the frequency of the first reference clock PCK and the complementary second reference clock PCK2N# in response to the output signal of the seventh NAND gate ND7, an eighth NAND gate ND8 which NANDs the second reference clock PCK2N and the frequency change end signal SETEND2N, and a ninth NAND gate ND9 which NANDs the output signal of the eighth NAND gate ND8 and the first reference clock PCK and outputs the second internal clock ICLK2N.

When the first control signal TERSYNC is activated (transitions to a low level), the sixth NAND gate ND6 activates (transitions to a high level) the sync reset signal SYNCRST.

When the frequency change signal FRE2N is activated (transitions to the high level), the seventh NAND gate ND7 effectively inverts the first reference clock PCK and outputs a resultant signal.

The seventh flip-flop F7 outputs the second reference clock PCK2N with the frequency corresponding to ½ of the frequency of the first reference clock PCK and the complementary second reference clock PCK2N# in response to the activated sync reset signal SYNCRST and the output signal of the seventh NAND gate ND7.

The output signal of the eighth NAND gate ND8 does not toggle before the frequency change end signal SETEND2N is activated (transitions to the high level) even though the eighth NAND gate ND8 receives the second reference clock PCK2N. If the frequency change end signal SETEND2N is activated (transitions to the high level), the eighth NAND gate ND8 receives the second reference clock PCK2N and outputs a signal with a frequency corresponding to ½ of the frequency of the first reference clock PCK and the external clocks CLK and CLK#.

The ninth NAND gate ND9 NANDs the output signal of the eighth NAND gate ND8 and the first reference clock PCK and outputs the second internal clock ICLK2N. Before the output signal of the eighth NAND gate ND8 toggles, the ninth NAND gate ND9 outputs the first reference clock PCK as the second internal clock ICLK2N. If the output signal of the eighth NAND gate ND8 toggles, the ninth NAND gate ND9 outputs the signal with the frequency corresponding to ½ of the frequency of the first reference clock PCK and the external clocks CLK and CLK#, as the second internal clock ICLK2N. In other words, the clock generation unit 300 does not change the frequency of the second internal clock ICLK2N to ½ of the frequency of the first reference clock PCK and the external clocks CLK and CLK# before the frequency change end signal SETEND2N is activated. Rather, it changes the frequency of the second internal clock ICLK2N to ½ of the frequency of the first reference clock PCK and the external clocks CLK and CLK# when the frequency change end signal SETEND2N is activated.

Further, the clock generation unit 300 outputs the first reference clock PCK as the first internal clock ICLK1N and supplies the first internal clock ICLK1N to an internal circuit of the semiconductor apparatus that needs the same frequency as the first reference clock PCK and the external clocks CLK and CLK#.

Figure 7:
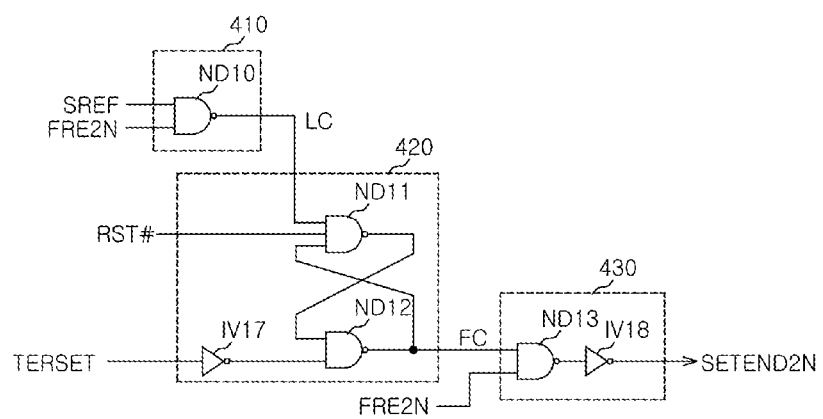
FIG. 7 is a detailed circuit diagram of the sensing unit shown in FIG. 3.

FIG. 7 is a detailed circuit diagram of the sensing unit 400 shown in FIG. 3.

Referring to FIGS. 3 to 7, the sensing unit 400 is configured to generate the frequency change end signal SETEND2N in response to the second control signal TERSET, the reset signal RST#, the frequency change signal FRE2N and the self refresh signal SREF.

The sensing unit 400 includes a latch control section 410, a latch section 420, and a frequency change end signal output section 430.

The latch control section 410 includes a tenth NAND gate ND10 which NANDs the self refresh signal SREF and the frequency change signal FRE2N and outputs a latch control signal LC.

The latch section 420 includes an eleventh NAND gate ND11 which NANDs the reset signal RST#, the latch control signal LC and the output signal of a twelfth NAND gate ND12, a seventeenth inverter IV17 which inverts the second control signal TERSET, and the twelfth NAND gate ND12 which NANDs the output signal of the eleventh NAND gate ND11 and the output signal of the seventeenth inverter IV17.

The frequency change end signal output section 430 includes a thirteenth NAND gate ND13 which NANDs the frequency change signal FRE2N and the output signal of the twelfth NAND gate ND12, and an eighteenth inverter IV18 which inverts the output signal of the thirteenth NAND gate ND13.

The latch control section 410 receives the self refresh signal SREF and the frequency change signal FRE2N and outputs the latch control signal LC for controlling the latch section 420 via the tenth NAND gate ND10.

In the case where the self refresh signal SREF is activated, the semiconductor apparatus enters the self refresh mode and deactivates all clocks. When the semiconductor apparatus starts operating after the self refresh mode, a clock with a frequency different from a preset frequency is likely to be outputted, which may be problematic. To avoid this, the sensing unit 400 uses the self refresh signal SREF as a control signal and deactivates the frequency change end signal SETEND2N when the self refresh signal SREF is activated, thereby securing operational reliability.

The latch section 420 outputs a flag control signal FC set at a high level from the twelfth NAND gate ND12 when the second control signal TERSET is activated (transitions to a high level). The frequency change end signal output section 430 receives the flag control signal FC set at the high level and the activated frequency change signal FRE2N (with the high level), and activates (transitions to the high level) the frequency change end signal SETEND2N.

The latch section 420 outputs the flag control signal FC set at a low level from the twelfth NAND gate ND12 when the second control signal TERSET is deactivated. The frequency change end signal output section 430 deactivates the frequency change end signal SETEND2N in response to the flag control signal FC.

The sensing unit 400 outputs the frequency change end signal SETEND2N in response to the second control signal TERSET outputted from the command shifter 200. The sensing unit 400 outputs the frequency change end signal SETEND2N in the activated state when the second control signal TERSET is inputted in the activated state, and outputs the frequency change end signal SETEND2N in the deactivated state when the second control signal TERSET is inputted in the deactivated state.

Figure 8:
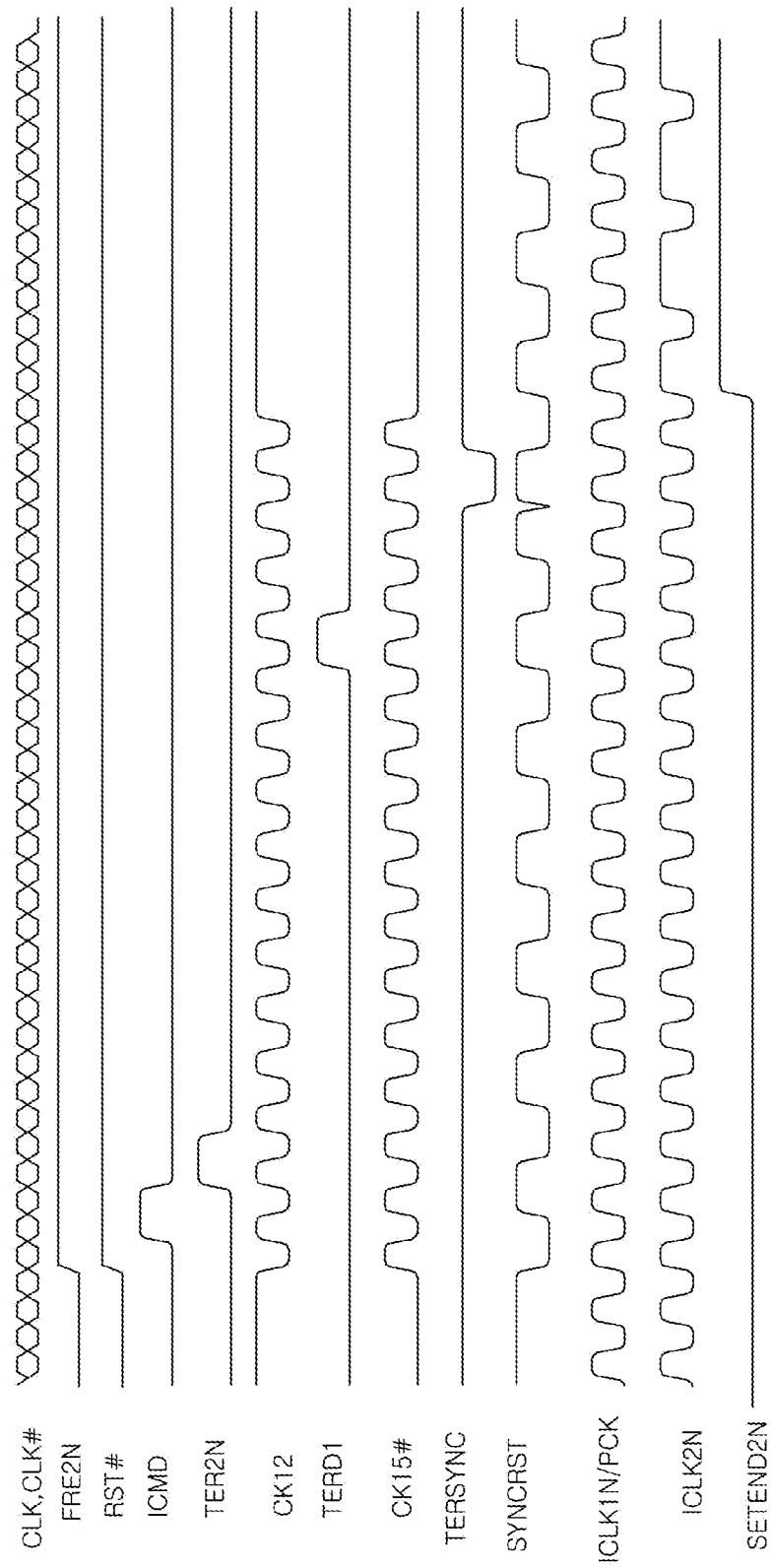
FIG. 8 is an operation timing diagram of the semiconductor apparatus in accordance with the embodiment of the present invention.

FIG. 8 is an operation timing diagram of the semiconductor apparatus in accordance with an embodiment of the present invention.

Operations of the semiconductor apparatus in accordance with an embodiment of the present invention will be described below with reference to FIGS. 3 to 8.

The amplification unit 500 outputs the first reference clock PCK with the same frequency as the external clocks CLK and CLK# in response to the external clocks CLK and CLK#.

The sync pulse generation unit 100 generates the no operation command TER2N with a high level pulse when the frequency change signal FRE2N, the reset signal RST# and the internal command ICMD are activated.

The command shifter 200 delays the first reference clock PCK by a predetermined time and generates the fourth delayed clock CK12 and the fifth delayed clock CK15# until the frequency change signal FRE2N and the frequency change end signal SETEND2N are activated. The fourth delayed clock CK12 and the fifth delayed clock CK15# have a complementary relationship.

The control signal generation unit 200 receives the no operation command TER2N and generates the first delayed no operation command TERD1 in response to the fourth delayed clock CK12. The first delayed no operation command TERD1 has a high level pulse after being delayed by a predetermined time when compared to the no operation command TER2N.

Moreover, the control signal generation unit 200 delays the first delayed no operation command TERD1 by a predetermined time in response to the fifth delayed clock CK15# and outputs the first control signal TERSYNC. The first control signal TERSYNC has a low level pulse after being delayed by a predetermined time when compared to the first delayed no operation command TERD1.

The clock generation unit 300 initializes the seventh flip-flop F7 when the first control signal TERSYNC is activated (has the low level pulse). The sync reset signal SYNCRST which initializes the seventh flip-flop F7 toggles in response to the first control signal TERSYNC when the first control signal TERSYNC is activated.

The clock generation unit 300 outputs the first internal clock ICLK1N with the same frequency as the first reference clock PCK. The first internal clock ICLK1N may be the same as the first reference clock PCK.

The clock generation unit 300 changes the frequency of the second internal clock ICLK2N when the frequency change end signal SETEND2N is activated (transitions to the high level). In the embodiment of the present invention, the frequency of the second internal clock ICLK2N is changed to ½ of the frequency of the first internal clock ICLK1N, the first reference clock PCK and the external clocks CLK and CLK# when SETEND2N is activated.

The sensing unit 400 activates (transitions to the high level) the frequency change end signal SETEND2N in response to the second control signal TERSET which is delayed by a predetermined time when compared to the no operation command TER2N.

If the frequency change end signal SETEND2N is activated (transitions to the high level), the sync pulse generation unit 100 does not repeatedly output the no operation command TER2N in the activated state even when the internal command ICMD is changed.

While certain embodiments have been described above, it will be understood to those skilled in the art that the embodiments described are by way of example only. Accordingly, the semiconductor apparatus described herein should not be limited based on the described embodiments. Rather, the semiconductor apparatus described herein should only be limited in light of the claims that follow when taken in conjunction with the above description and accompanying drawings.

What is claimed is:

1. A semiconductor apparatus comprising:
   a clock frequency change block configured to output a plurality of internal clocks with different frequencies by dividing a frequency of an external clock in response to a mode register set signal and a setting command to enable the plurality of internal clocks to be outputted, and generate a frequency change end signal to designate the completion of a mode for changing frequencies of the internal clocks; and a command generation block configured to receive a command and generate the setting command in response to the frequency change end signal and the mode register set signal.

2. The semiconductor apparatus according to claim 1, wherein the clock frequency change block generates a first internal clock with the same frequency as the external clock and a second internal clock with a different frequency from the external clock when the setting command and the mode register set signal are activated.

3. The semiconductor apparatus according to claim 2, wherein the frequency of the second internal clock corresponds to ½ of the frequency of the first internal clock.

4. The semiconductor apparatus according to claim 1,
wherein the command generation block activates the setting command when the frequency change end signal is in a deactivated state and the mode register set signal is in an activated state, and
wherein the command generation block deactivates the setting command even though the mode register set signal is in the activated state, when the frequency change end signal is in an activated state.

5. A semiconductor apparatus comprising:
a clock frequency change block configured to generate a plurality of internal clocks with different frequencies by dividing an external clock in response to a frequency change signal which allows a mode for changing a frequency of a clock to be entered and a no operation command which sets to allow the plurality of internal clocks to be generated, and generate a frequency change end signal to designate the completion of the mode for changing a frequency of a clock, in response to the no operation command; and
a command generation block configured to receive a command and generate the no operation command in response to the frequency change signal and the frequency change end signal.

6. The semiconductor apparatus according to claim 5, wherein the clock frequency change block comprises:
a command shifter configured to delay the no operation command by a predetermined time, and generate a first control signal and a second control signal which have a complementary relationship;
a clock generation unit configured to receive a first reference clock which is generated by amplifying the external clock, and generate a first internal clock having a frequency equivalent to that of the first reference clock and a second internal clock having a frequency different than that of the first reference clock, in response to the first control signal, the frequency change signal and the frequency change end signal; and
a sensing unit configured to activate the frequency change end signal in response to the second control signal and the frequency change signal.

7. The semiconductor apparatus according to claim 6, wherein the command shifter comprises:
a reference clock delay section configured to delay the first reference clock by the predetermined time in response to the frequency change signal and the frequency change end signal, and generate a plurality of delayed clocks; and a control signal generating section configured to delay the no operation command in response to the plurality of delayed clocks, and generate the first control signal and the second control signal.

8. The semiconductor apparatus according to claim 7, wherein the control signal generating section comprises:
a control signal output part configured to delay the no operation command by the predetermined time in response to the plurality of delayed clocks, and output the first control signal and the second control signal; and
an initialization part configured to generate a signal for initializing the control signal output part, in response to a self refresh signal, a reset signal and the frequency change signal.

9. The semiconductor apparatus according to claim 8, wherein the self refresh signal is deactivated after a self refresh mode, and the initialization part generates the signal for initializing the control signal output part, by receiving the self refresh signal in the deactivated state and the reset signal and the frequency change signal in the activated states.

10. The semiconductor apparatus according to claim 7, wherein the reference clock delay section delays the first reference clock and generates the plurality of delayed clocks when the frequency change signal and the frequency change end signal are inputted in the activated states.

11. The semiconductor apparatus according to claim 6, wherein the clock generation unit generates a second reference clock by dividing the first reference clock in response to the frequency change signal and the first control signal, and outputs the second reference clock as the second internal clock when the frequency change end signal is activated.

12. The semiconductor apparatus according to claim 11, wherein the clock generation unit is set to generate the second internal clock when the first control signal and the frequency change signal are inputted in activated states.

13. The semiconductor apparatus according to claim 11, wherein the frequency of the second internal clock corresponds to ½ of the frequency of the first internal clock when the frequency change end signal is activated; and
wherein the frequency of the second internal clock does not correspond to ½ of the frequency of the first internal clock when the frequency change end signal is deactivated.

14. The semiconductor apparatus according to claim 6, wherein the sensing unit retains the frequency change end signal in the deactivated state when the second control signal is inputted in a deactivated state, and activates the frequency change end signal when the second control signal is inputted in an activated state.

15. The semiconductor apparatus according to claim 6, wherein the sensing unit comprises:
a latch control section configured to generate a latch control signal in response to a self refresh signal and the frequency change signal;
a latch section configured to output a flag control signal which is activated when the second control signal in the activated state is inputted and is deactivated when the second control signal in the deactivated state is inputted, in response to a reset signal and the latch control signal; and
a frequency change end signal output section configured to generate the frequency change end signal in response to the flag control signal and the frequency change signal.

16. The semiconductor apparatus according to claim 15, wherein the latch control section deactivates the frequency change end signal when the self refresh signal is in an activated state in the self refresh mode of the semiconductor apparatus.

17. The semiconductor apparatus according to claim 5, wherein the command generation block comprises:
   a command output unit configured to latch the command and generate an internal command; and
   a sync pulse generation unit configured to receive the internal command and generate the no operation command in response to a reset signal, the frequency change signal and the frequency change end signal.

18. The semiconductor apparatus according to claim 17, wherein the sync pulse generation unit comprises:
   a sync pulse control section configured to generate an enable signal in response to the frequency change signal, the reset signal and the frequency change end signal; and
   a sync pulse operation section configured to generate the no operation command in response to the internal command and the enable signal.

19. The semiconductor apparatus according to claim 18, wherein the sync pulse control section generates the enable signal which is activated when the frequency change end signal is inputted in a deactivated state and is deactivated when the frequency change end signal is inputted in an activated state, with the frequency change signal and the reset signal being in activated states.

20. The semiconductor apparatus according to claim 19, wherein the sync pulse operation section activates the no operation command when the internal command and the enable signal are inputted in activated states, and deactivates the no operation command when the enable signal is inputted in a deactivated state.

* * * * *